United States Patent [19]

Moeller

[11] 4,408,166
[45] Oct. 4, 1983

[54] PULSE WIDTH MODULATION DECODER
[75] Inventor: Roy P. Moeller, Hayward, Calif.
[73] Assignee: Altex Scientific, Inc., Berkeley, Calif.
[21] Appl. No.: 388,315
[22] Filed: Jun. 14, 1982

Related U.S. Application Data
[63] Continuation of Ser. No. 220,869, Dec. 29, 1980, abandoned.

[51] Int. Cl.³ .............................................. H03K 9/08
[52] U.S. Cl. ...................................... 329/106; 375/94
[58] Field of Search ..................... 329/104, 106, 102; 375/22, 94-96

[56] References Cited
U.S. PATENT DOCUMENTS

| | | | |
|---|---|---|---|
| 3,571,736 | 3/1971 | West | 329/104 |
| 3,597,693 | 8/1971 | McNeilly | 329/104 X |
| 3,624,529 | 11/1971 | Gebelein, Jr. | 329/104 |
| 3,886,463 | 5/1975 | Caprio | 329/106 |
| 4,249,136 | 2/1981 | Suzuki et al. | 330/251 |

FOREIGN PATENT DOCUMENTS 589689 1/1978 U.S.S.R. ............................ 329/106

Primary Examiner—Siegfried H. Grimm
Attorney, Agent, or Firm—R. J. Steinmeyer; Robert R. Meads; John R. Shewmaker

[57] ABSTRACT

A decoder for pulse width modulated (PWM) signals comprising an integrator and a sample-and-hold circuit wherein the sample-and-hold output signal is fed back to the input of the integrator. No periodic initialization of the integrator is required. The gains of the integrator and sample-and-hold circuits and the capacitance of the integrator capacitor affect only the settling time of the decoder, not the value to which the decoder output ultimately settles.

8 Claims, 4 Drawing Figures

PULSE WIDTH MODULATION DECODER

This is a continuation of application Ser. No. 220,869, filed Dec. 29, 1980 and now abandoned.

BACKGROUND OF THE INVENTION

1. Field of the Invention

The present invention relates to circuits for decoding or demodulating pulse width modulated (PWM) signals.

2. Description of the Prior Art

Pulse width modulation (PWM) is a method of encoding a sequence of numerical values by modulating the duty cycle of a fixed-frequency square-wave carrier signal. More specifically, the duty cycle of each successive period of the carrier signal is modulated so as to be proportional to the corresponding numerical value in the sequence. The information represented by the sequence of numerical values is typically either a succession of distinct measurement results or else periodic samples of a continuous waveform.

The purpose of a PWM decoder is to recover from the modulated signal the originally encoded sequence of numerical values, typically by generating an analog signal successively proportional thereto. One known PWM decoder comprises a resistor-capacitor integrator circuit. Before each successive period of the PWM signal, the integrator is initialized by discharging the integrator capacitor. During the period, a fixed current is supplied to the integrator capacitor during the time the PWM square-wave has one of its two alternating values. At the end of the period, the capacitor voltage is proportional to the duty cycle of the PWM signal during that period, and hence to the value of the encoded information. This capacitor voltage is typically stored by a sample-and-hold circuit so that the integrator can immediately thereafter be initialized to decode the next period of the PWM signal.

One disadvantage of the described prior art PWM decoder is that its output voltage is inversely proportional to the capacitance of the integrator capacitor. Since it generally is impractical to manufacture capacitors to high tolerances, such a PWM decoder generally requires expensive individual calibration to attain high accuracy. In addition, the integrator capacitor is subject to thermal drift which upsets the accuracy of such calibration.

Another disadvantage of the described prior art PWM decoder is that it requires initialization between each period of the PWM square-wave signal by discharging the integrator capacitor. However, capacitors suffer a dielectric absorption effect that prevents them from being completely discharged during the short time available before the beginning of each period. This introduces an offset error in the decoder output.

SUMMARY OF THE INVENTION

The present invention is a decoder for pulse width modulated (PWM) signals comprising an integrator and a sample-and-hold circuit wherein the sample-and-hold output signal is fed back to the input of the integrator.

One advantage of the present invention is that the integrator need not be initialized periodically. If the integrator is implemented with an integrator capacitor, the capacitor need not be discharged periodically, thereby avoiding offset errors due to the dielectric absorption of the capacitor.

Another advantage of the present invention is that, after an initial settling time, the decoder output settles to a value independent of the gains of the integrator and sample-and-hold circuits. In particular, if the integrator is implemented with an integrator capacitor, the settled value is independent of the capacitance of the integrator capacitor. As a result, high decoder accuracy can be achieved without calibrating the decoder to compensate for capacitor tolerances. In addition, the decoder accuracy is not degraded by the capacitor's thermal drift. The only effect of capacitor deviations is a change in the decoder's settling time.

DETAILED DESCRIPTION OF THE PREFERRED EMBODIMENTS

Before discussing the operation of the PWM decoder according to the present invention, the characteristics of a PWM signal will be reviewed.

Figure 1:
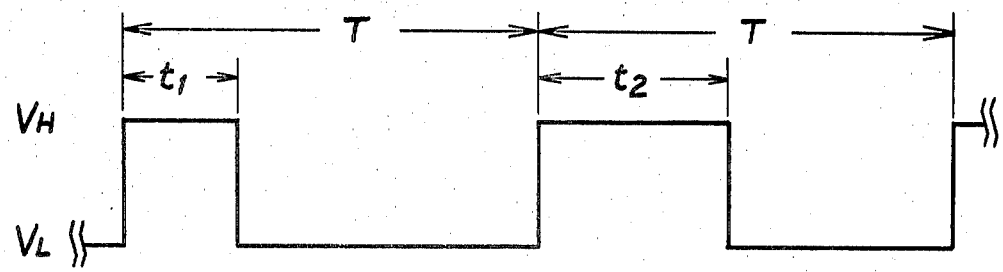
FIG. 1 is a waveform diagram of a PWM signal having a fixed repetition period T, each period beginning with a "low" to "high" transition.

FIG. 1 depicts the waveform of a typical PWM signal. The signal alternates between "high" and "low" values $V_H$ and $V_L$ at a fixed frequency or repetition rate $1/T$, or equivalently, a fixed repetition period T. The duty cycle of each period of the PWM signal is the ratio of the time "t" that the PWM signal is "high" during the period to the total duration "T" of the period. For example, FIG. 1 illustrates two periods of a PWM signal having duty cycles of $t_1/T$ and $t_2/T$ during the first and second periods, respectively.

Figure 2:
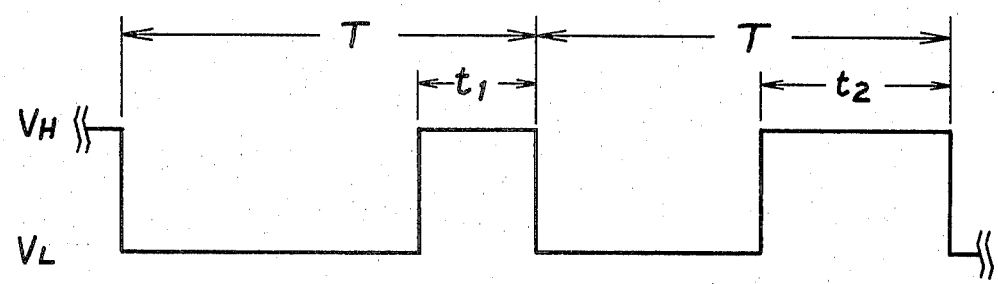
FIG. 2 is a waveform diagram of a PWM signal having a fixed repetition period T, each period beginning with a "high" to "low" transition.

Each period of the PWM signal shown in FIG. 1 consists of a first time interval when the PWM signal is "high", followed by a second time interval when the PWM signal is "low". FIG. 2 depicts a PWM signal identical to that shown in FIG. 1 except that the first and second time intervals are reversed. In other words, each period of the PWM signal shown in FIG. 2 consists of a first time interval when the PWM signal is "low", followed by a second time interval when the PWM signal is "high". In both Figures, the sum of the durations of the first and second time intervals within each period is the repetition period T of the PWM signal. In practice, a PWM signal may be encoded according to either one of the two formats illustrated in FIGS. 1 and 2.

Figure 3:
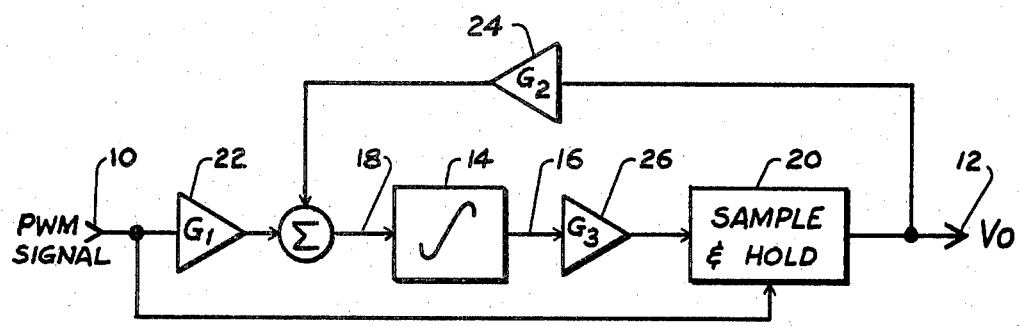
FIG. 3 is a block diagram of a PWM decoder according to the present invention.

FIG. 3 is a block diagram of a PWM decoder according to the present invention. The PWM decoder receives a PWM signal at input terminal 10 and produces a decoder output signal $V_o$ at output terminal 12 whose value during each period of the PWM signal is proportional to the duty cycle of the PWM signal during the preceding period.

The PWM decoder includes an integrator 14 that produces an output signal 16 proportional to the time integral of its input signal 18. Sample-and-hold circuit 20 produces the decoder output signal $V_o$ by sampling the integrator output signal 16 at a time related to the beginning of each period of the PWM signal 10. By so doing, the sampling may occur at any time within the repetition period T so long as the time period between sampling, that is, the sampling period, equals the repetition period T of the PWM signal. Such can be accomplished within the sample-and-hold circuit 20 by performing the sampling at a time related to the transition of the PWM signal from its second value to its first value. Conveniently, the sampling can occur at the beginning of each period of the PWM signal concurrently with the transition of the PWM signal from its second value to its first value. In such an instance, the decoder output signal 12 equals a proportionality factor $G_3$ times the value of the integrator output signal 16 at the time of the most recent transition of the PWM signal 10 from its second value to its first value.

The integrator input signal 18 is obtained by summing a first value equal to a proportionality factor $G_1$ times the input signal 10 and a second value equal to a proportionality factor $G_2$ times the decoder output signal 12. In FIG. 3, blocks 22, 24 and 26 are used to represent the proportionality factors $G_1$, $G_2$ and $G_3$. While such proportionality factors may be implemented as separate amplifiers, blocks 22, 24 and 26 are more preferably incorporated in the circuits which implement integrator 14 and sample-and-hold 20. For example sample-and-hold 20 may include an amplifier whose gain determines the proportionality factor $G_3$. Thus, such an amplifier would be an element of both sample-and-hold 20 and block 26. Another example is the preferred embodiment of integrator 14 shown in FIG. 4, which includes capacitor 28, amplifier 34, and resistors 38 and 36. Although the circuit operation will be described more fully below, it may be recognized at this point that the proportionality factors $G_1$ and $G_2$ are inversely proportional to the resistances of resistors 38 and 36, respectively. Thus, blocks 22 and 24 respectively comprise resistors 38 and 36, such resistors also being elements of integrator 14.

Analysis of the PWM decoder system shown in FIG. 3 reveals that, after an initial settling time, the decoder output signal converges to a value $V_o$ proportional to the duty cycle t/T of the PWM signal and independent of the proportionality factor or gain constant $G_3$. More specifically, the value to which the decoder output signal settles is given by the following equation:

$$V_o = (-G_1/G_2)[V_L + (V_H - V_L)(t/T)] \quad (1)$$

If the "low" value $V_L$ of the PWM signal equals zero, then the preceding equation may be simplified as follows:

$$V_o = -V_H(G_1/G_2)(t/T) \quad (2)$$

The settling time required for the value $V_o$ of the output signal to converge to the values given in Equations (1) and (2) above is determined by the product of the proportionality constants $G_2$ and $G_3$. The PWM decoder is said to be critically damped when the product of $G_2$ and $G_3$ equals minus one times the repetition frequency 1/T of the PWM signal. When critically damped, the settling time of the PWM decoder is zero; that is, the value $V_o$ of the decoder output signal assumes the values given in Equations (1) and (2) above immediately after each period of the PWM signal, without any initial settling time.

If the product $G_2 G_3$ differs somewhat from the critical damping value $-1/T$, a settling time will be required for the output signal $V_o$ of the PWM decoder to converge to the values given in Equations (1) and (2). The greater the difference between the product $G_2 G_3$ and the critical damping value, the longer the required settling time. If the product $G_2 G_3$ is less than or equal to $-2/T$ or is greater than or equal to zero, the PWM decoder will be unstable and the decoder output $V_o$ will never converge to a stable value.

In practice, it is very easy to insure that the PWM decoder will always be stable. Even if the repetition frequency of the PWM signal is irregular or unknown, stability may be assured by establishing the product $G_2 G_3$ so that its sign is negative and its magnitude is less than two times the highest possible repetition frequency of the PWM signal.

Figure 4:
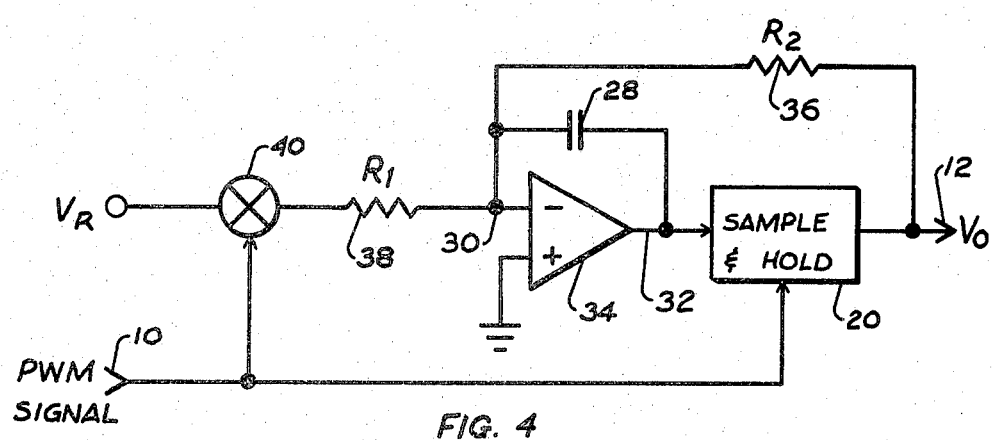
FIG. 4 is an electrical schematic of the preferred embodiment of a PWM decoder according to the present invention.

FIG. 4 shows the preferred embodiment of a PWM decoder according to the present invention. In the preferred embodiment, integrator 14 comprises a capacitor 28 connected between inverting input 30 and output 32 of an operational amplifier 34. Because of the high gain of operational amplifier 34, the voltage at the amplifier inverting input 30 essentially equals zero volts, and the voltage at the amplifier output 32 equals the voltage across the capacitor 28. Sample-and-hold circuit 20 samples the capacitor voltage at the beginning of each period of the PWM signal and produces decoder output voltage $V_o$ at output terminal 12 equal to the most recently sampled value of the capacitor voltage. If the PWM decoder is being used to decode a PWM signal of a type shown in FIG. 1, the sample-and-hold circuit 20 should be triggered by each "low" to "high" transition of the PWM signal 10. To decode PWM signals of the type shown in FIG. 2, the sample-and-hold circuit should trigger on "high" to "low" transitions of the PWM signal.

Resistor 36 connects between amplifier inverting input 30 and decoder output 12, thereby supplying to capacitor 28 a current proportional to the decoder output voltage $V_o$. Similarly, resistor 38 connects to amplifier inverting input 30 to supply capacitor 28 a current proportional to the duty cycle of the PWM signal received at input terminal 10. However, resistor 38 is not connected directly to input terminal 10; instead, resistor 38 is switchably connected to a reference voltage source $V_R$ through analog switch 40. Switch 40 is controlled by the PWM signal received at input terminal 10 so as to be closed and opened, respectively, when the PWM signal has its "high" and "low" values. Switch 40 makes the decoder operation independent of the amplitude of the incoming PWM signal by effectively replacing it with one having a fixed high value $V_R$ and a fixed low value of zero.

In operation, the decoder output voltage $V_o$ converges after an initial settling period to the value given by the following equation wherein $R_1$ and $R_2$ denote the resistances of resistors 38 and 36, respectively:

$$V_o = -V_R(R_2/R_1)(t/T) \quad (3)$$

Equation (3) shows that the decoder output voltage $V_o$ is directly proportional to the duty cycle t/T of the PWM signal and is independent of the capacitance of capacitor 28.

The values of resistor 36 and capacitor 28 determine the stability and settling time of the PWM decoder shown in FIG. 4. The decoder will be critically damped and the settling time will be zero if the product of the resistance of resistor 36 and the capacitance of capacitor 28 equals the repetition period T of the PWM signal. The settling time of the decoder will increase as this resistance-capacitance product deviates from the critically damped value. However, the decoder will be stable so long as the resistance-capacitance product is greater than one-half the critically damped value, that is, greater than one-half the repetition period T.

An advantage of the described PWM decoder is that, unlike prior art designs, it does not require initialization by periodically discharging the integrator capacitor. The present invention thereby avoids offset errors inherent in prior art designs because of dielectric absorption which prevents the integrator capacitor from being completely discharged.

Another advantage of the described PWM decoder is that the value to which the decoder output voltage settles is independent of the capacitance of the integrator capacitor. As a result, the accuracy of the decoder will not be degraded by the use of an integrator capacitor subject to thermal drift and having only ordinary capacitance tolerances.

Another advantage of the present invention is that the decoder output is proportional to the true duty cycle t/T. In contrast, many prior art designs produce an output proportional only to the duration "t" of the "high" interval within each period of the PWM signal, independent of the repetition period T.

I claim:

1. Apparatus for decoding a pulse width modulated (PWM) signal which alternates between first and second values comprising:
   an integrator circuit, responsive to the PWM signal and a decoder output signal, for producing an integrator output signal whose value equals the sum of a first value proportional to the time integral of the PWM signal and a second value proportional to the time integral of the decoder output signal; and
   a sample-and-hold circuit, responsive to the PWM signal and the integrator output signal, for producing the decoder output signal proportional to the value of the integrator output signal at the time of the most recent transition of the PWM signal from its second value to its first value.

2. Apparatus according to claim 1 wherein the integrator circuit comprises:
   a capacitor, the integrator output signal being the voltage across the capacitor;
   first charging means for supplying to the capacitor a current having first and second values when the PWM signal is at its first and second values, respectively; and
   second charging means for supplying to the capacitor a current proportional to the decoder output signal, the total current supplied to the capacitor being the algebraic sum of the respective currents supplied by the first and second charging means.

3. Apparatus according to claim 1 wherein the integrator circuit comprises:
   a capacitor, the integrator output signal being the voltage across the capacitor;
   first charging means for supplying to the capacitor a fixed current when the PWM signal is at one of its first and second values and zero current when the PWM signal is at the other of its first and second values; and
   second charging means for supplying to the capacitor a current proportional to the decoder output signal and having a polarity opposite that of the fixed current, the total current supplied to the capacitor being the algebraic sum of the respective currents supplied by the first and second charging means.

4. Apparatus for decoding a pulse width modulated (PWM) signal which alternates between first and second values and has a fixed repetition period, the repetition period of the PWM signal being defined as the time interval between successive transitions of the PWM signal from its second value to its first value, comprising:
   a capacitor having two terminals between which appears a capacitor voltage;
   a sample-and-hold circuit for storing the value of the capacitor voltage at the time of the most recent transition of the PWM signal from its second value to its first value and for producing a decoder output signal proportional to the stored capacitor voltage value;
   first charging means for supplying to the capacitor a fixed current when the PWM signal is at one of its first and second values and zero current when the PWM signal is at the other of its first and second values; and
   second charging means for supplying to the capacitor a current having a polarity opposite that of the fixed current and having a value equal to the product of the capacitor voltage value stored by the sample-and-hold circuit and a proportionality constant, the proportionality constant being less than two times a critical damping value, the critical damping value being equal to the capacitance of the capacitor divided by the repetition period of the PWM signal.

5. Apparatus according to claim 4 wherein:
   the apparatus further comprises an amplifier having an inverting input and an output respectively connected to the two terminals of the capacitor;
   the first charging means comprises
     a first resistor having first and second terminals, the first terminal thereof being connected to the amplifier inverting input, and
     means for applying to the second terminal of the first resistor a fixed voltage when the PWM signal is at one of its first and second values and zero voltage when the PWM signal is at the other of its first and second values; and the second charging means comprises
     a second resistor having first and second terminals, the first terminal thereof being connected to the amplifier inverting input, and
     means for applying to the second terminal of the second resistor a voltage equal to said proportionality constant, multiplied by the capacitor voltage stored by the sample-and-hold circuit, multiplied by the resistance of the second resistor.

6. Apparatus according to claim 5 wherein:
   the resistance of the second resistor equals the reciprocal of the proportionality constant, and
   the voltage applied to the second terminal of the second resistor equals the capacitor voltage stored by the sample-and-hold circuit.

7. Apparatus according to claim 4, 5 or 6, wherein the second charging means comprises means for establishing the proportionality constant as substantially equal to the critical damping value.

8. Apparatus for decoding a pulse width modulated (PWM) signal which alternates between first and second values and has a repetition period, the repetition period of the PWM signal being defined as the time between successive transitions of the PWM signal from its second value to its first value, comprising:
 an integrator circuit, responsive to the PWM signal and a decoder output signal, for producing an integrator output signal whose value equals the sum of a first value proportional to the time integral of the PWM signal and a second value proportional to the time integral of the decoder output signal; and
 a sample-and-hold circuit, responsive to the PWM signal and the integrator output signal, for producing the decoder output signal proportional to the value of the integrator output signal at a time related to the transition of the PWM signal from its second value to its first value.

* * * * *